United States Patent [19]

Nishiura et al.

[11] Patent Number: 4,609,770

[45] Date of Patent: Sep. 2, 1986

[54] THIN-FILM SOLAR CELL ARRAY

[75] Inventors: Masaharu Nishiura; Osamu Nabeta, both of Kanagawa, Japan

[73] Assignee: Fuji Electric Corporate Research & Development Ltd., Kanagawa, Japan

[21] Appl. No.: 660,607

[22] Filed: Oct. 11, 1984

[30] Foreign Application Priority Data

Dec. 8, 1983 [JP] Japan .................. 58-231796

[51] Int. Cl.⁴ .................. H01L 27/08; H01L 27/14
[52] U.S. Cl. .................. 136/244; 136/251; 136/258
[58] Field of Search ........ 136/244, 245, 251, 258 AM

[56] References Cited

U.S. PATENT DOCUMENTS 4,245,386  1/1981  Kausche et al. ............ 29/572
4,433,201  2/1984  Fellas ....................... 136/251
4,537,838  8/1985  Jetter et al. ................ 429/9

FOREIGN PATENT DOCUMENTS 57-63866  4/1982  Japan ..................... 136/251
1023847   3/1966  United Kingdom ........ 136/251

Primary Examiner—Aaron Weisstuch
Attorney, Agent, or Firm—Sughrue, Mion, Zinn, Macpeak, and Seas

[57] ABSTRACT

A thin-film solar cell device in which multiple series-connected cell elements are formed in units which can then be readily joined together in either a series or parallel connection. At least two terminal electrodes are provided on the opposite side of the insulating substrate of each unit, connected to the respective end electrodes of the elements at the extreme ends on the obverse surface of the substrate. This may be done either by bending the flexible substrate around at opposite ends at angles of 180°, or by forming through-holes in the substrate at opposite ends and filling the through-holes with a conductive material. Units can then be joined merely by overlapping their edge portions and connecting them with a conductive adhesive.

8 Claims, 15 Drawing Figures

THIN-FILM SOLAR CELL ARRAY

BACKGROUND OF THE INVENTION

The present invention relates to a solar cell having a thin film of, for example, amorphous silicon formed on a flexible substrate.

Amorphous silicon (hereunder a-Si) solar cells using amorphous silicon formed by the glow discharge decomposition of silane gas are considered most promising as low-cost solar cells, and many researchers are engaged in active efforts to improve the conversion efficiency of such cells. The a-Si cells, produced by vapor phase growth techniques, provide a large area for receiving sunlight. Since these cells can be fabricated at temperatures as low as 200° to 300° C., they allow a great latitude in the selection of substrate materials. As a further advantage, an a-Si film has good adhesion to the substrate material so that a flexible substrate can be used without any reduction in the performance characteristics of the cell due to flexing of the substrate.

A typical example of a conventional thin-film a-Si solar cell is depicted in FIG. 1. The cell has a substrate 1 which is an insulating film of a thickness of 50 to 100 microns and which is made of a polymeric material such as polyamide. The substrate is successively overlaid with a metal electrode 2, a p-type a-Si film 3, an undoped a-Si film 4, and an n-type a-Si film 5. The metal electrode 2 is formed by sputtering or electron-beam vapor depositing a high-melting point metal such as stainless steel, chromium, titanium, or molybdenum. The p-type a-Si 3 is deposited on the metal electrode, heated to 200° to 300° C., by decomposing a reactive gas (silane+1% diborane) at 1 to 10 Torr in a glow-discharge plasma produced by a radio frequency field. The undoped a-Si film 4 is formed to a thickness of about 0.5 microns on the p-type a-Si film 3 by the glow discharge decomposition of silane gas. The n-type a-Si film 5 is formed on the undoped a-Si film by the decomposition of a reactive gas (silane+1% phosphine). The p-i-n type a-Si layer composed of the films 3, 4, and 5 is overlaid with a transparent electrode 7 made of ITO (indium tin oxide) or SnO$_2$ (tin oxide) and is formed to a thickness of 700 to 2,000 Å by a suitable technique such as sputtering, electron-beam vapor deposition, or thermal CVD.

FIGS. 2A and 2B show a solar cell array wherein a plurality of cell elements having the configuration shown in FIG. 1 are connected in series, of which FIG. 2A is a plan view thereof and FIG. 2B is a cross section taken along a line A—A in FIG. 2A. In the embodiment shown, a flexible insulating substrate 1 is overlaid with three strips of metal electrode 2 as well as a terminal electrode 21. These electrodes may be formed by vapor deposition using a metal mask. The metal electrodes 2 are respectively overlaid with three discrete strips of an a-Si layer 6 having a p-i-n junction. The regions of the a-Si layer 6 may be formed of an a-Si layer which is deposited on the entire surface of the substrate and then divided into three separate areas by photoetching. The three a-Si layers are respectively overlaid with a transparent electrode 7 formed with the aid of a metal mask. Three solar cell elements 11, 12, and 13, each composed of a metal electrode 2, a-Si layer 6 and transparent electrode 7, are connected in series, and their output is taken at the end portion 20 of the metal electrode of the leftmost element 11 and the terminal electrode 21.

The solar cell array shown in FIG. 2 is excited when sunlight falls on the transparent electrodes 7. Since the terminals 20 and 21 are on the side of the insulating substrate on which the sunlight falls, the output characteristics of the array must be measured with a lead inserted to connect the terminals 20 and 21 on the incident side of the substrate. In this case, the leads or the terminals should not interfere with the incoming light. When two solar cell arrays of the configuration shown in FIGS. 2A and 2B are connected in series, an electrode 21 on one substrate must be connected to an electrode 20 on the other substrate by a metal foil or lead wire in such a manner that the latter does not interfere with the path of the incoming light. The same precautions must be taken in parallel connecting the two arrays, and this puts a considerable limit on the type of electrical components that can be used in establishing connection and involves much difficulty in attaining the desired connection.

SUMMARY OF THE INVENTION

It is therefore an object of the present invention to provide a solar cell having terminals that permit easy electrical connection without experiencing the difficulties conventionally encountered in connecting solar cells provided on an opaque flexible substrate.

According to the present invention, the stated and other objects are achieved by a thin-film solar cell comprising a plurality of cell elements each having a first electrode, a thin semiconductor film and a transparent second electrode formed successively on the obverse surface of a flexible insulating substrate, these elements being connected in series by the second electrode which overlaps the first electrode of an adjacent element or a separate terminal electrode formed on the obverse surface of the substrate, characterized in that the opposite surface of the substrate as at least two terminal electrodes made of a metal layer and which are respectively connected to the first electrode of a cell element at the extreme end of the obverse surface of the substrate and to the terminal electrode on the same obverse surface. To accomplish this, the flexible substrate may be bent at both ends at an angle of 180° in such a manner that the first electrode of the cell element at the extreme end of the obverse surface of the substrate and the terminal electrode of the same obverse surface extend to its back side to provide respective terminal electrodes on the opposite surface of the substrate. Otherwise, the terminal electrodes on the opposite surface of the substrate may be connected to the first electrode and terminal electrode on the obverse surface of the substrate by a conductive material that fills holes formed in the substrate and which are positioned at the back of each of the first electrode and terminal electrode.

BRIEF DESCRIPTION OF THE DRAWINGS

FIGS. 2A and 2B show an embodiment of a solar cell wherein a plurality of cell elements are connected in series, of which FIG. 2A is a plan view and FIG. 2B is a cross section taken along a line A—A in FIG. 2A;

FIGS. 5A and 5C show an a-Si solar cell according to the present invention which is formed on a flexible substrate of a large area, of which FIG. 5A is a plan view and FIGS. 5B and 5C are cross sections of 5A taken along lines X—X and Y—Y, respectively;

FIGS. 7A to 7C show an a-Si solar cell according to another embodiment of the present invention formed on a flexible substrate of a large area, of which FIG. 7A is a plan view and FIGS. 7B and 7C are cross sections of FIG. 7A taken along lines X—X and Y—Y, respectively;

DESCRIPTION OF THE PREFERRED EMBODIMENTS

Figure 1:
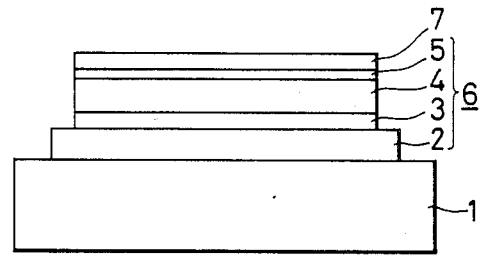
FIG. 1 is a cross section of an a-Si solar cell.
Figure 2A:
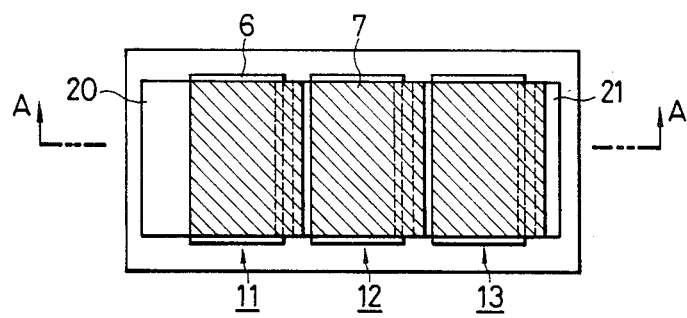
Figure 2B:
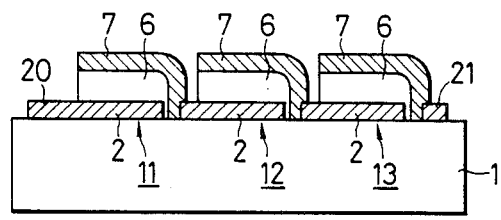
Figure 3:
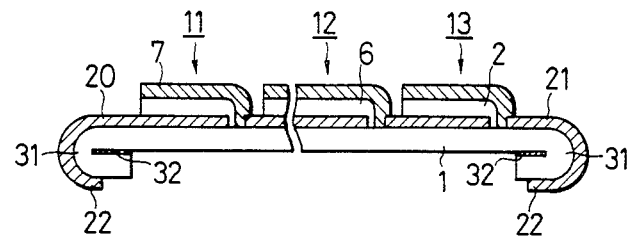
FIG. 3 is a cross-sectional view of a first preferred embodiment of a solar cell of the present invention.

FIG. 3 shows a solar cell array according to a preferred embodiment of the present invention which, as in FIG. 2, is composed of three cell elements 11, 12, and 13. However, in the solar cell array of the invention, the electrode 20 of the leftmost element 11 and the terminal electrode 21 extend past the edges of a flexible substrate and are bent downwardly at an angle of 180° at end portions 31 of the substrate 1, and sealed to the bottom of the substrate 11 by an adhesive 32. For ease of fabrication, the use of a quick drying adhesive such as "Aron Alpha" (tradename of a product of Toagosei Chemical Co., Ltd., of Japan) is recommended. According to the embodiment of FIG. 3, metal electrodes 22 are formed on the side of the flexible substrate 1 which is opposite to the side where sunlight falls.

Figure 4:
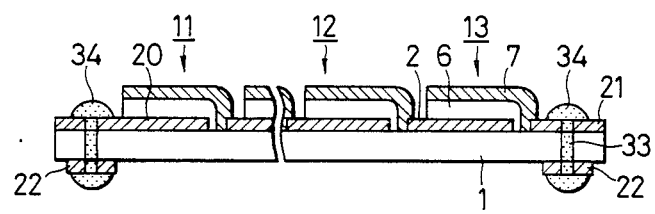
FIG. 4 is a cross-sectional view showing a second embodiment of a solar cell of the present invention.

FIG. 4 shows another embodiment of the present invention in which electrodes 22 made of a vapor-deposited metal layer are formed on the opposite surface of the flexible substrate 1 in areas which correspond to the electrodes 20 and 21 formed at both ends of the obverse surface of the substrate. A hole 33 penetrating the substrate 1 is formed in each electrode 22. This hole 33 is made by punching or the like either before or after the fabrication of the electrodes 22. The hole 33 has a diameter of about 200 microns to 1 mm, which is greater than the thickness of the substrate 1. When a conductive adhesive such as silver paste 34 is forced into the hole 33, the paste spreads and wets both the metal electrode 20 or terminal electrode 21 and the electrode 22 on the reverse surface of the substrate so as to establish an electrical connection between the electrodes on the obverse and reverse surfaces of the substrate. As a result of this procedure, either of the electrodes 22 on the reverse surface of the substrate shown in FIG. 3 or 4 can be connected to an external lead wire without the possibility of interfering with the path of the incident sunlight.

Figure 5A:
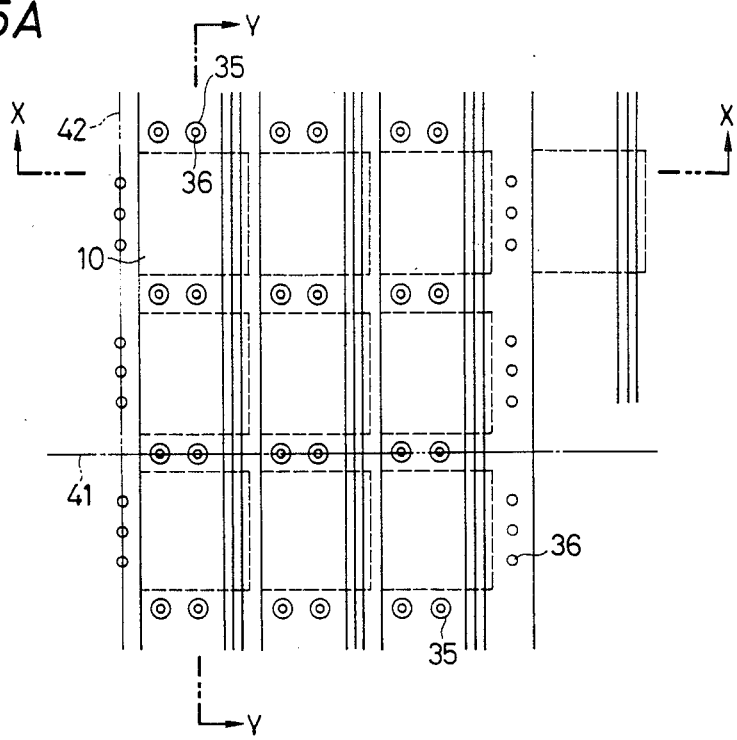
Figure 5B:
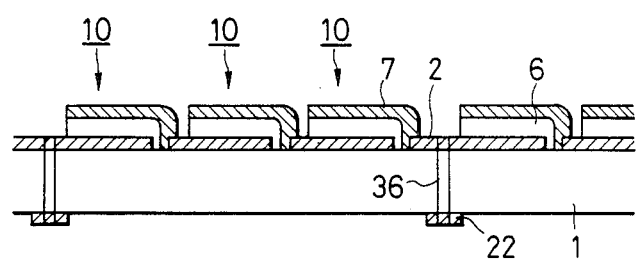
Figure 5C:
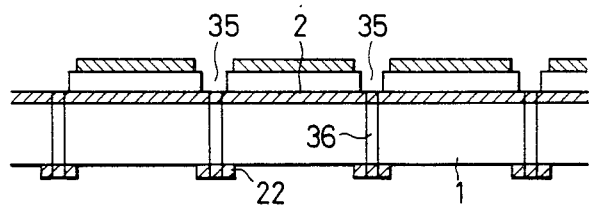

In the embodiment of FIGS. 5A to 5C, a plurality of a-Si solar cells according to the present invention are formed on a flexible substrate of a large area. FIG. 5A is a plan view, and FIGS. 5B and 5C are cross sections taken on lines X—X and Y—Y, respectively. In the embodiment shown, three series-connected cell elements 10 are arranged in three rows. As can be seen from FIG. 5C, the metal electrode 2 is continuous in the direction of the line Y—Y. The a-Si layer 6 is also continuous in the direction of the line Y—Y, but is provided with large holes 35 between adjacent rows of series-connected cell elements 10. The holes 35 are formed simultaneously with the patterning of the a-Si layer 6. The metal electrode 2 and substrate 1 are provided with through-holes 36 which are smaller than the holes 35 and positioned both between adjacent rows of series-connected cell elements and between each array of series-connected cell elements. The holes 36 between cell elements in the direction of the line X—X are preferably concentric with the holes 35. As in the case of FIG. 4, electrodes 22 are formed around the holes 36 on the side of the substrate opposite the side where the holes 35 are formed.

The solar cell array shown in FIG. 5A is cut along a perforated line 41 or 42 with a cutter or scissors. The perforated line 41 is used to separate otherwise parallel-connected cell elements arranged in the direction of the line Y—Y and to leave a sequence of series-connected cell elements, while the perforated line 42 is used to separate different sequences of otherwise series-connected cell elements arranged in the direction of the line X—X and to leave a small sequence of series-connected and parallel-connected cell elements. If a solar cell module providing a large current but low voltage is required, the perforated line 42 is used, and if a module for high voltage operation is necessary, the perforated line 41 is used. By connecting these two kinds of modules, a system capable of producing desired levels of voltage and current can be provided. In the embodiment of FIGS. 5A to 5C, the smallest unit of thin-film solar cells that can be used independently is three series-connected elements, but it should be understood that the number of cell elements that are connected in series to make the smallest unit may be varied depending on the application.

Figure 6:
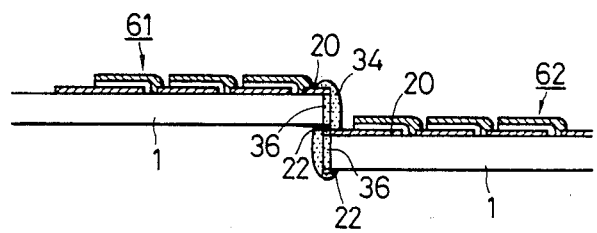
FIG. 6 is a cross section showing interconnections of solar cell units separated from the substrate shown in FIG. 5A.

FIG. 6 shows an embodiment wherein solar cell units separated at the perforated line 42 shown in FIG. 5 are subsequently interconnected. The concept shown in connection with FIG. 6 also applies to the case where solar cell units are separated at the perforated line 41. Two units 61 and 62, each composed of three series-connected cell elements, are placed in a partially overlapping relation so that the holes 36 in one unit, which now have a semi-circular cross section as a result of the separation at the perforated line 42, are in alignment with the holes 36 in the other unit, which also have a semi-circular cross section. A conductive adhesive 34 is applied to the joining edges of the units so as to establish an electrical connection between the metal electrode 20 at the end portion of the obverse surface of the unit 61 and the terminal electrode 22 formed at the end portion of the reverse surface of the unit 62. As a result, the two units 61 and 62, each having three series-connected cell elements, are connected in series. The thicknesses of each unit shown in FIG. 6 are exaggerated; in actuality, the substrate 1 has a thickness of about 100 microns and each hole 36 a diameter of about 0.5 mm. Therefore, the two units 61 and 62 can be connected by simply injecting the conductive adhesive 34 from the side of only one unit.

Figure 7A:
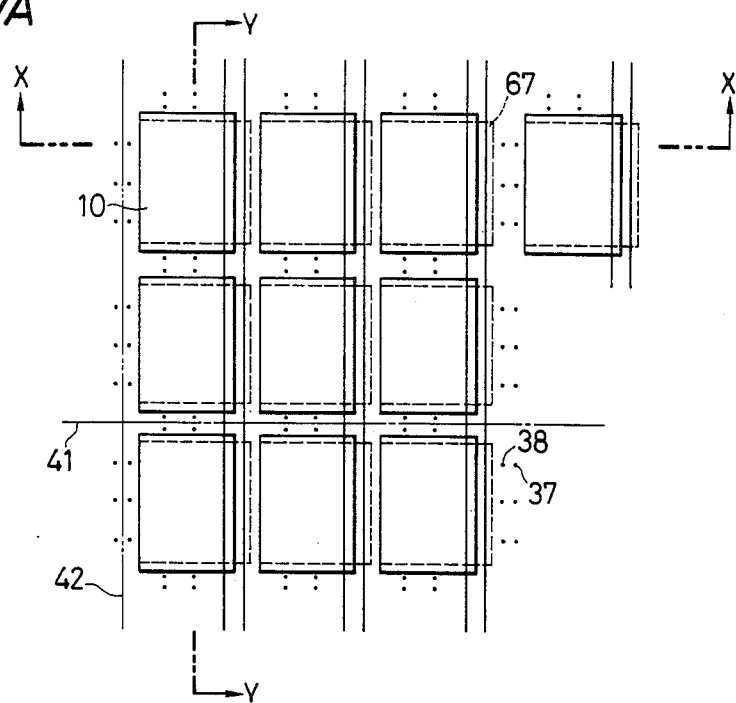
Figure 7B:
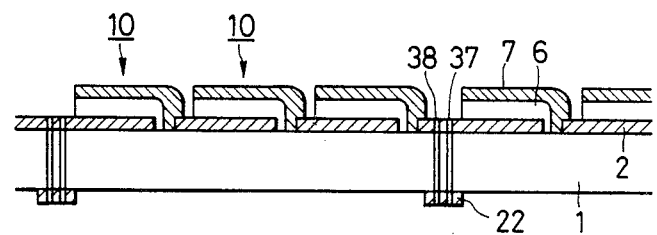
Figure 7C:
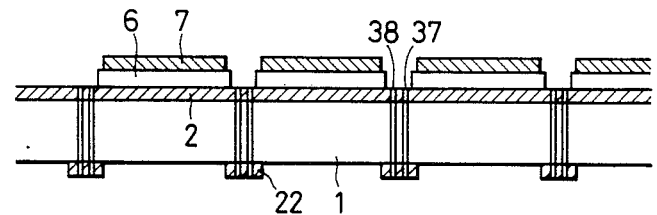

FIGS. 7A to 7C show an embodiment somewhat different from that of FIGS. 5A to 5C, of which FIG. 7A is a plan view and FIGS. 7B and 7C are cross sections taken along lines X—X and Y—Y, respectively, in FIG. 7A. In this embodiment, each of the holes 36 is replaced by two adjacent holes 37 and 38 between which the perforated lines 41 and 42 are provided. In the embodiment shown, the a-Si layer 6 is not continuous in the direction of the line Y—Y, but if desired, the a-Si layer 6 may be rendered continuous as in the case of FIGS. 5A to 5C with the diameters of holes 37 and 38 being made slightly larger than in the case of FIGS. 5A to 5C. A common factor to both the embodiment of FIGS. 5A to 5C and that of FIGS. 7A to 7C is that the transparent electrode 7 is discontinuous in the direction of the line Y—Y and no part of it is provided with holes 36 or pairs of holes 37 and 38. This arrangement is necessary for permitting two units of solar cell elements to be separated without causing a short circuit between the transparent electrode 7 and the metal electrode 2.

Figure 8:
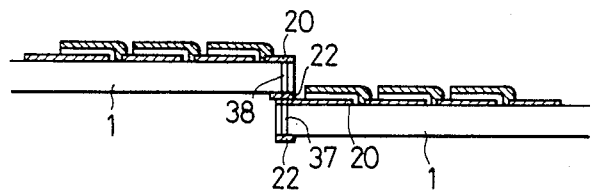
FIG. 8 is a cross section showing interconnected solar cell units separated from the substrate shown in FIG. 7A.

FIG. 8 shows an embodiment wherein solar cell units separated at the perforated line 42 shown in FIG. 7 are subsequently interconnected. The holes 37 and 38 remain circular even after separation at the line 42. Thus, the embodiment of FIG. 8 permits easier alignment and has a smaller chance of leakage of the adhesive than in the case of the embodiment of FIG. 6.

Figure 9:
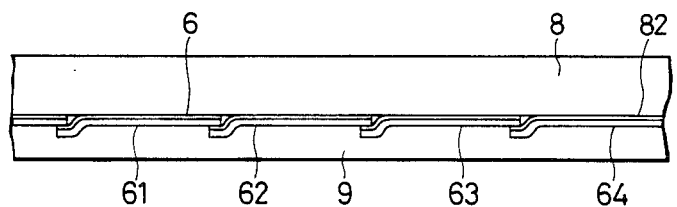
FIG. 9 is a cross section showing essential parts of a solar cell module composed of cell units having the configuration shown in FIG. 4.

FIG. 9 shows an illustrative module fabricated by interconnecting thin-film solar cell units provided by the procedure described above. In the embodiment of FIG. 9, four units 61 to 64 of a suitable size are interconnected. First, the unit 61 is bonded to a glass plate 8 on the side of the thin semiconductor film 6 by an adhesive such as an epoxy compound. Then, the adjacent unit 62 is placed on the unit 61 in a partially overlapping relation so that the centers of holes 36 (in the case of the FIGS. 5A to 5C embodiment) or those of holes 37 and 38 (in the case of the FIGS. 7A to 7C embodiment) are in alignment. Again, the thin semiconductor film 6 on the unit 62 is bonded to the glass plate 8 by an adhesive. Subsequently, a conductive material is forced into the holes 36 or the holes 37 and 38, thereby establishing electrical connection between two overlapping electrodes. After bonding the two other units 63 and 64 to the glass plate 8 in the same manner, the resulting combination of the four units is covered with a protective film 9 on the side opposite the glass plate. The protective film may be made of an epoxy resin. The thus-fabricated module may be installed on glass windows of a building or used as a substitute for wall paper. In this case, in order to let in a maximum amount of light, the flexible substrate 1 and the protective film 9 should have the highest degree of transparency. Another effective way to attain the same result is by replacing the metal electrode 2 with a transparent electrode. The shape of the metal electrode 2 as well as the size and layout of holes 36, 37 and 38 may be modified to suit a specific decorative purpose.

Figure 10:
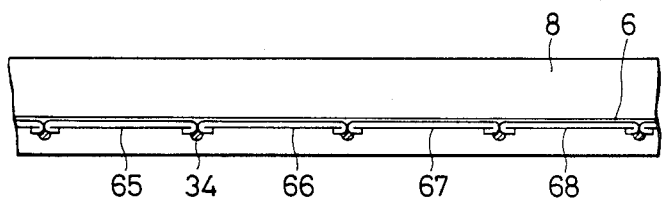
FIG. 10 is a cross section showing a solar cell module composed of cell units having the configuration shown in FIG. 3.

FIG. 10 shows an embodiment using solar cell units of the type shown in FIG. 3. Four units 65 to 68 are arranged side by side and bonded to a glass substrate 8 on the side of a thin semiconductor film 6. As in the case of FIG. 9, a conductive adhesive 34 is subsequently applied to connect the units either in series or in parallel. One particular advantage with the embodiment of FIG. 10 is that the units fixed to the glass plate 8 can be interconnected by applying the conductive adhesive to the side opposite that where sunlight falls, and therefore the solar cell system of FIG. 10 can be easily fabricated by an automated process.

In the embodiment shown above, a conductive adhesive is used for interconnection of the electrodes, but it should be understood that they may be connected by soldering if the flexible substrate is sufficiently heat resistant.

According to the thin-film solar cell of the present invention which is formed on the obverse surface of a flexible substrate, output electrodes are provided on the opposite surface of the substrate by either bending the substrate downwardly by an angle of 180° together with an extension of each output electrode, or by connecting each output electrode to a corresponding electrode on the obverse surface of the substrate by means of a conductive material such as a conductive adhesive applied into through-holes in the substrate. Due to this arrangement, the output electrodes can be connected to either themselves or external lead wires on the back side of the substrate by any suitable means without interfering with the incident light. As a further advantage, a plurality of solar cells having the configuration shown above may be formed on a flexible substrate of a large area and subsequently cut into units of a desired size and then interconnected by, for example, application of an adhesive with the aid of the electrodes formed on the reverse surface of each cell unit. By this procedure, a solar cell module producing a voltage and current required by the user can be readily obtained. Since the solar cell of the present invention may be installed on windows, an array of cells may be combined to present various patterns with the aid of the metal electrodes or interconnection through-holes if decorative purposes are of primary concern. A greater freedom in design can be provided by replacing the metal electrodes with transparent ones.

We claim:

1. In a thin-film solar cell array comprising a plurality of unit cell elements each having a first electrode, a thin semiconductor film, and a transparent second electrode deposited successively on an obverse surface of a flexible insulating substrate, said elements being electrically connected in series by a second electrode which overlaps the first electrode of an adjacent element, and a terminal electrode formed on said obverse surface of the substrate and connected to the second electrode of an element at an extreme end of said obverse surface, the improvement wherein on the opposite surface of said substrate there are provided at least two terminal electrodes made of metal layers deposited on said substrate and which are respectively connected electrically to the first electrode of an element at the other extreme end of said obverse surface of the substrate and to said terminal electrode on said obverse surface, all said electrodes providing current paths for solar cell power through said cell elements.

2. The thin-film solar cell array according to claim 1, wherein said flexible substrate is bent downwardly at both ends by an angle of substantially 180° in such a manner that the first electrode of the cell element at the other extreme end of said obverse surface of said substrate and the terminal electrode on said obverse surface extend to a rear side of said substrate to provide said terminal electrodes on said opposite surface of said substrate.

3. The thin-film solar cell array according to claim 1, wherein said terminal electrodes on said opposite surface of said substrate are connected to said first electrode and said terminal electrode on said obverse surface of the substrate by a conductive material that fills holes formed through said substrate and which are positioned at the back of each of said first electrode and terminal electrode.

4. The thin-film solar cell array according to claim 3, wherein said holes are provided in pairs, and wherein cell elements are separated between said holes of said pairs.

5. The thin-film solar cell array of claim 3, wherein one of said terminal electrodes on the opposite side of the substrate of one solar cell array is juxtaposed and connected to said terminal element on the obverse surface of the substrate of another like solar cell array and said one and said another solar cell arrays were previously joined along a line of a plurality of said holes.

6. The thin-film solar cell array according to claim 1, wherein said thin semiconductor film comprises an amorphous silicon film.

7. The thin-film solar cell array of claim 6, wherein said flexible, insulating substrate is made of a polymeric material.

8. The thin-film solar cell array of claim 1, wherein one of said terminal electrodes on the opposite surface of the substrate of one solar cell array is juxtaposed and connected to said terminal element on the obverse surface of the substrate of another like solar cell array.

* * * * *